(12) United States Patent
Bautista, Jr. et al.

(10) Patent No.: US 6,980,473 B1
(45) Date of Patent: Dec. 27, 2005

(54) MEMORY DEVICE AND METHOD

(75) Inventors: Edward V. Bautista, Jr., Sunnyvale, CA (US); Ken Cheong Cheah, Penang (MY); Chi-Mun Ho, Seremban (MY)

(73) Assignee: Advanced Micro Devices, Inc., Sunnyvale, CA (US)

( * ) Notice: Subject to any disclaimer, the term of this patent is extended or adjusted under 35 U.S.C. 154(b) by 209 days.

(21) Appl. No.: 10/677,031

(22) Filed: Oct. 1, 2003

(51) Int. Cl.$^7$ .............................. G11C 16/04
(52) U.S. Cl. .................. 365/189.01; 365/189.09; 365/185.02; 365/185.22
(58) Field of Search .................. 365/189.01, 189.09, 365/185.02, 185.22, 185.23

(56) References Cited

U.S. PATENT DOCUMENTS 6,795,344 B2 * 9/2004 Lin ......................... 365/185.2
6,906,966 B2 * 6/2005 Shor et al. ............. 365/189.09

* cited by examiner

*Primary Examiner*—Anh Phung
*Assistant Examiner*—Toan Le
(74) *Attorney, Agent, or Firm*—Paul Drake; Rennie Wm. Dover

(57) ABSTRACT

A memory device and a method for compensating for a load current in the memory device. The memory device includes a plurality of I/O buffers where each I/O buffer includes an I/O write-buffer driver circuit. The I/O write-buffer driver circuit is coupled to a load current compensation circuit. Although each I/O buffer includes an I/O write-buffer circuit, a single load current compensation circuit may be coupled to several I/O write-buffer driver circuits. The load current compensation circuit generates a load compensation current for each I/O buffer circuit that is not being programmed. The load compensation current increases the load current so that a drain-side programming voltage (VPROG) drives a substantially constant load current, wherein the drain-side programming voltage is substantially independent of the number of bits being programmed.

14 Claims, 2 Drawing Sheets

MEMORY DEVICE AND METHOD

FIELD OF THE INVENTION

This invention relates, in general, to memory devices and, more particularly, to memory devices having a flash architecture.

BACKGROUND OF THE INVENTION

Memory devices are used in a variety of electronic systems including computers, cellular phones, pagers, personal digital assistants, avionic systems, automotive systems, industrial control systems, appliances, etc. Depending on the particular system configuration, the memory devices may either be non-volatile or volatile. A non-volatile memory device retains the data or instructions stored therein after the device has been turned off or power is removed. A volatile memory device, on the other hand, does not retain the stored data or instructions after the device has been turned off. Flash memory has become an important type of non-volatile memory because it is less expensive to manufacture and denser than most other types of memory devices. In addition, Flash memory is electrically erasable and has a life span of up to one million write cycles.

A typical Flash memory includes a plurality of input-output (I/O) buffers configured to form an I/O structure capable of receiving input data of a predetermined word length. For example, an I/O structure configured as a sixteen-bit word is comprised of sixteen I/O buffers where each I/O buffer receives a single bit of the sixteen bit word. During programming, the I/O buffers that are to be programmed are enabled and a programming signal (VPROG) is placed on data nodes of those I/O buffers. If a single bit is to be programmed, programming signal VPROG is placed on the data node corresponding to that single bit. If a plurality of bits are to be programmed, the programming signal VPROG is placed on each data node corresponding to a bit to be programmed. For example, if the second, fourth, and ninth least significant bits of a sixteen bit word are to be programmed, programming signal VPROG is placed on the data nodes of the I/O buffers that correspond to the second, fourth, and ninth least significant bits of the sixteen bit word. The data nodes of the I/O buffers corresponding to the unprogrammed bits are left floating. The voltage level or magnitude of VPROG is dependent on the number of bits being programmed, i.e., the voltage level of VPROG is lower when programming a plurality of bits than when programming a single bit. The largest decrease in VPROG occurs when the maximum number of bits are being programmed. In a sixteen-bit word, the largest decrease in VPROG occurs when all sixteen bits are programmed. A drawback in the voltage level of VPROG being dependent on the number of bits being programmed is that a wide distribution of programming voltages occurs resulting in some bits being programmed to a lower voltage level than desired. This variation may lead to erroneous read operations.

Accordingly, what is needed is a method and a structure for maintaining the programming voltage at a specified level independent of the number of bits being programmed.

SUMMARY OF THE INVENTION

The present invention satisfies the foregoing need by providing a memory device having a load current compensation circuit and a method for maintaining a substantially constant load current independent of the number of bits being programmed. In accordance with one aspect, the present invention comprises a method for programming a memory device having a programming node. A programming voltage provided at the programming node is used to generate a load current. The load current is used to generate a load voltage at a compensation node of the memory device. An error voltage is generated in response to the load voltage. A load compensation current is generated in accordance with the error voltage, wherein the load compensation current changes the magnitude of the load current.

In accordance with another aspect, the present invention comprises a method for regulating a programming voltage in a memory device. A load current is generated in accordance with the programming voltage. The load current is changed by applying a programming voltage to a load compensation network. The load compensation network changes the load current to simulate programming a predetermined number of data bits of the memory device.

In accordance with yet another aspect, the present invention comprises a memory device having a programming circuit coupled to a load current compensation circuit. The programming circuit has a programming terminal coupled for receiving a programming signal. Likewise, the load current compensation circuit has an input terminal coupled for receiving the programming signal.

BRIEF DESCRIPTION OF THE DRAWINGS

The present invention will be better understood from a reading of the following detailed description, taken in conjunction with the accompanying drawing figures, in which like reference numbers designate like elements, and in which.

DETAILED DESCRIPTION

Generally, the present invention provides a structure and a method of compensating for variations in the load current in a memory device while it is being programmed. In accordance with an embodiment of the present invention, a load compensation current is generated that is dependent on the number of bits that are not being programmed in a memory device. During programming, a drain side programming voltage (VPROG) is applied to the core cell. Although it is desirable for the magnitude of programming voltage VPROG to remain constant, it varies depending on the number of bits being programmed. The number of bits being programmed is referred to as the programming load or the load being driven by programming voltage or signal VPROG. The larger the number of bits being programmed, the larger the load being driven by the programming signal and the greater the decrease in the magnitude of the programming signal VPROG. Hence the load current compensation circuit generates a load compensation current that simulates the maximum number of bits being programmed. For example, if, in a sixteen-bit word, four of the bits are being programmed, the load current compensation circuit generates a load compensation current substantially equivalent to that which would be generated by the twelve bits not being programmed. In other words, programming signal VPROG always drives the equivalent load as if all sixteen bits were being programmed. Although the load compensation circuit has been described as being for a sixteen-bit word, this is not a limitation of the present invention. For example, the load compensation circuit is suitable for use with words having bit lengths of four bits, eight bits, thirty-two bits, sixty-four bits, etc.

Figure 1:
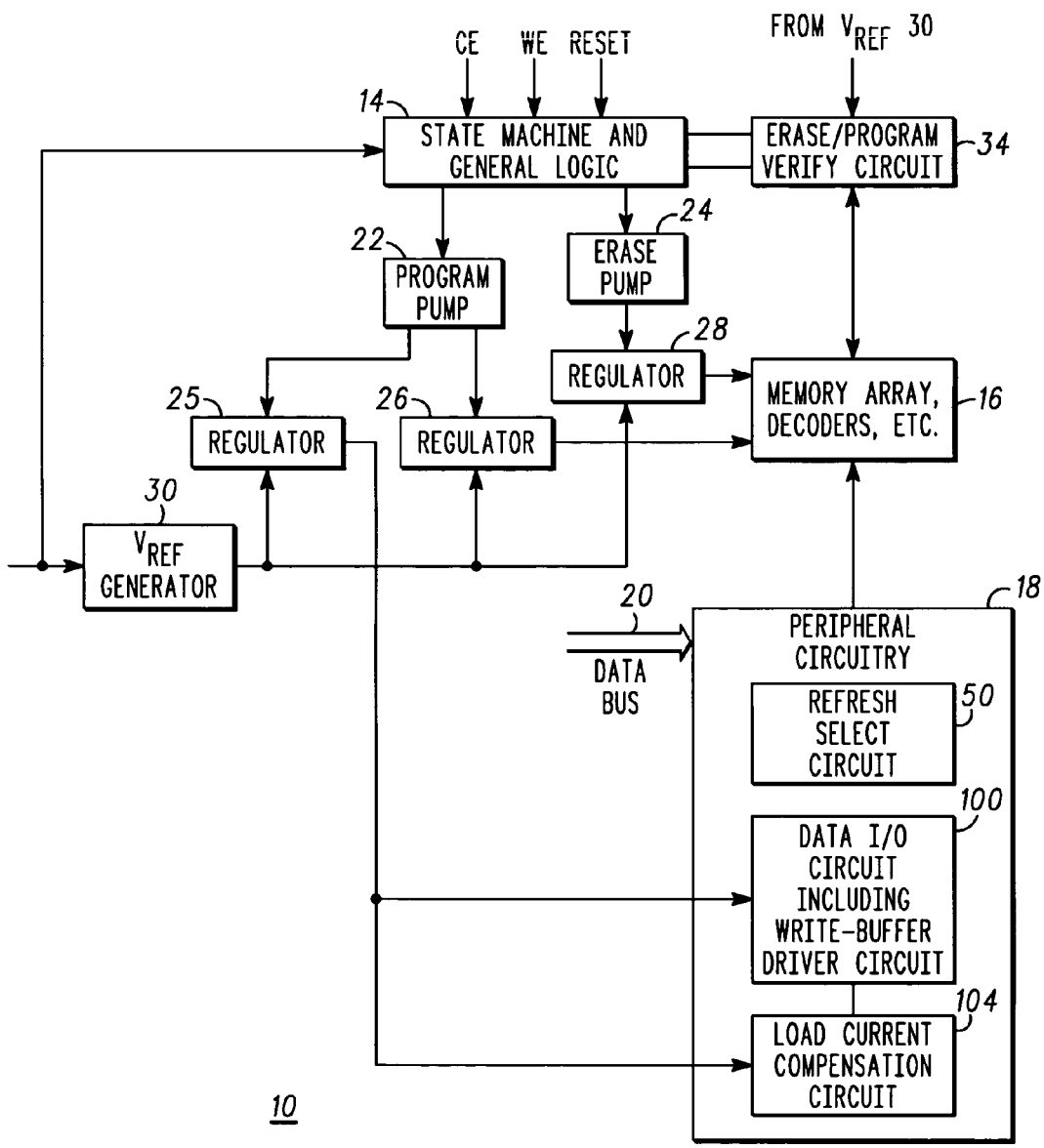
FIG. 1 is block diagram of a memory system having a write-buffer circuit and a load current compensation circuit in accordance with an embodiment of the present invention.

FIG. 1 is a block diagram of a memory system 10 incorporating a load current compensation circuit 104 in accordance with an embodiment of the present invention. Memory system 10 is part of an integrated circuit memory chip. For purposes of simplicity of explanation, memory system 10 will be described in the context of Flash memory, although one skilled in the art will understand and appreciate that other types of circuits such as, for example, a dynamic random access memory (DRAM) chip, a static random access memory (SRAM) chip, an electrically erasable and programmable read only memory (EEPROM) chip or the like, also may include a load current compensation circuit in accordance with an embodiment of the present invention.

Memory system 10 includes a state machine and general logic block 14 for controlling the operation of memory system 10. State machine 14 is coupled to a program pump 22 and to an erase pump 24 for respectively implementing program and erase operations relative to a memory block 16. For example, pumps 22 and 24 each receive a voltage control channel ($V_{cc}$) signal to supply a boosted voltage. Pumps 22 and 24 are further coupled to regulator circuits 26 and 28, respectively, and transfer high voltage signals to their associated regulator circuit. Voltage regulator circuits 26 and 28 receive a reference voltage signal from a reference voltage generator 30, which is activated in response to a State Machine On (SMON) signal. Typically, reference voltage generator 30 ramps up to a desired voltage level upon beginning a program/erase operation or a program/erase verify operation. Regulator circuits 26 and 28 are coupled to memory block 16 and, in particular, to the decoders comprising memory block 16. Regulator circuits 26 and 28 produce controlled voltage signals based on the reference voltage, which controlled voltage signals are selectively applied to the floating gate memory cells. In addition reference voltage generator 30 and pump 22 are coupled to a regulator circuit 25 for generating a programming voltage VPROG. Regulator circuit 25 is connected to a data input/output (I/O) circuit 100 and to a load current compensation circuit 104.

State machine 14 is also coupled to an erase/program verify circuit 34 for providing a VERIFY control signal to initiate a verify operation. For example, state machine 14 is programmed and/or configured to activate verify circuit 34 after every programming and erase operation in order to assure that the selected cell(s) have been effectively programmed or erased. Erase/program verify circuit 34 is operable to receive the reference voltage signal from reference voltage generator 30 and to generate erase verify voltage signals and program verify voltage signals, respectively, based on the reference voltage signal. Such verify signals are then selectively applied to the memory cells during a verify operation of the appropriate memory cell. Verify circuit 34 provides the results of the program verify operation to state machine 14.

State machine 14 controls the operation of pumps 22 and 24 in dependence on the control signals it receives. In other words, state machine 14 receives a plurality of input signals and controls operation of memory system 10 in accordance with these input signals. For example, state machine 14 receives a Chip Enable (CE) signal, a Write Enable (WE) signal, and a RESET signal. State machine 14 also receives the SMON signal from an associated processor or other device, wherein the SMON signal controls activation of state machine 14.

State machine 14 is operably coupled to a memory block 16 and programmed and/or configured to control the processes of storing charge on and removing charge from floating gate memory cells (not shown) of memory block 16. For example, state machine 14 controls the operation of memory block 16 in response to incoming command and control signals on control lines, such as from an associated processor (not shown). Memory block 16 includes decoders that are operable to program and erase cells of the flash memory upon receiving appropriate control signals. By way of example, memory block 16 includes a flash EEPROM comprising an array of memory cells and decoders for controlling which part of the memory array is to be accessed, such as for programming, erasing, and/or verifying operations in accordance with an embodiment of the present invention. More particularly, memory block 16 includes a core array which is made up of an M×N array of flash memory cells. A word line and control line driver provides appropriate control voltages to the core array via a plurality of word lines. Such control voltages allow data to be stored in, read from or erased from the memory cells. A bit line driver provides appropriate control voltages to and/or receives an output signal from a plurality of bit lines within the core array.

Memory system 10 further includes peripheral circuitry 18 which receives data via a data bus 20. Peripheral circuitry 18 includes a refresh select circuit 50, a data I/O circuit 100, and a current compensation circuit 104. Because data is stored in the form of a word comprising a plurality of bits, data I/O circuit 100 is comprised of a plurality of I/O buffers, where each I/O buffer receives one bit of the word. Thus, for a sixteen bit word, there are sixteen I/O buffers. The I/O buffers are configured to form two eight bit bytes which are typically referred to as the low byte of the word and the high byte of the word. Refresh select circuit 50 controls whether the low byte, the high byte, or the entire word is programmed, erased, or refreshed. Each I/O buffer 100 includes a write-buffer driver circuit 102 (shown in FIG. 2) to which data is written. It should be understood by those skilled in the art that peripheral circuitry 18 includes other types of circuitry such as, for example, an address decoder and a reference cell array. However, the additional elements of peripheral circuitry 18 are not shown for the sake of brevity.

Figure 2:
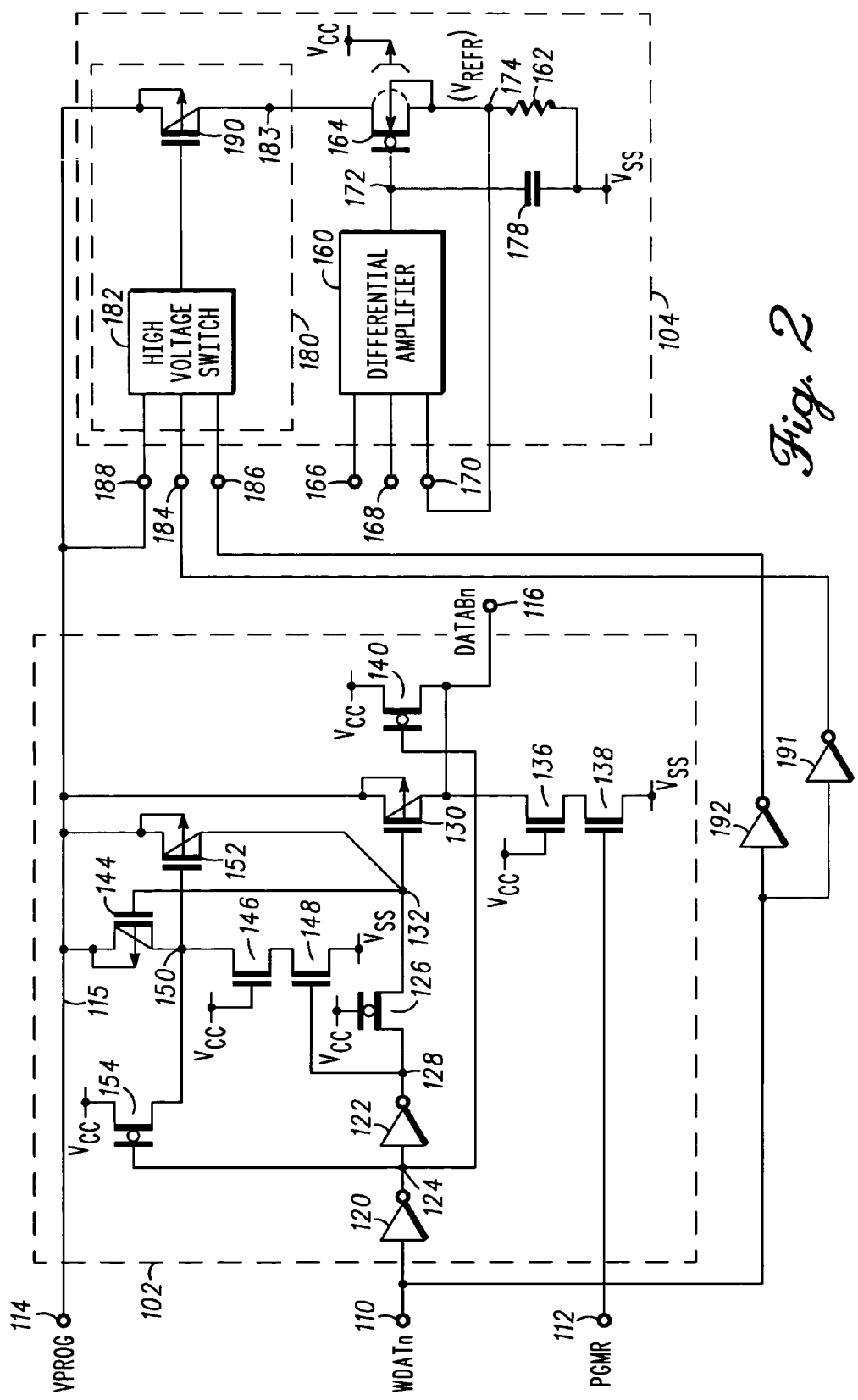
FIG. 2 is a schematic diagram of the write-buffer circuit and the load current compensation circuit of the memory system of FIG. 1.

FIG. 2 is a schematic diagram of write-buffer driver circuit 102 coupled to a load current compensation circuit 104 in accordance with an embodiment of the present invention. Write-buffer driver circuit 102, also referred to as a programming circuit, has an input terminal 110 coupled for receiving a programming bit information signal WDATn, a control terminal 112 coupled for receiving an output node discharge signal PGMR, a programming terminal 114 coupled for receiving a programming signal VPROG, and an output terminal 116 coupled for transmitting an output data signal DATABn. It should be noted that the letter "n" appended to the names WDAT and DATAB represents integers that identify the bit of the word to which the data signal corresponds. For example, WDATA0 is the programming bit information signal corresponding to bit 0, WDATA1 is the programming bit information signal corresponding to bit 1, WDATA2 is the programming bit information signal corresponding to bit 2, etc. Likewise, DATAB0 is the data signal corresponding to bit 0, DATAB1 is the data signal corresponding to bit 1, DATAB2 is the data signal corresponding to bit 2, etc.

Write-buffer driver circuit 102 comprises a plurality of N-channel transistors 136, 138, 146, and 148, a plurality P-channel enhancement mode transistors 130, 144, and 152, a plurality of low threshold voltage N-channel transistors 126, 140, and 154, and a plurality of inverters 120 and 122. More particularly, inverter 120 has an input terminal connected to input terminal 110 and an output terminal connected to an input terminal of inverter 122 at node 124. Alternatively, the input terminal of inverter 120 may serve as input terminal 110. An output terminal of inverter 122 is connected to a drain of low threshold voltage N-channel transistor 126 at node 128. A gate terminal of N-channel transistor 126 is coupled for receiving a source of operating potential such as, for example, $V_{cc}$, and a source of transistor 126 is connected to a gate terminal of P-channel enhancement mode transistor 130 at node 132. A drain of transistor 130 is connected to output terminal 116 and to a drain of N-channel transistor 136. A source of transistor 130 is connected to programming node 115 and to the body of semiconductor material from which the transistors are manufactured. It should be understood that programming node 115 is connected to programming terminal 114. A source of N-channel transistor 136 is connected to a drain of N-channel transistor 138 and the source of N-channel transistor 138 is coupled for receiving a source of operating potential such as for example, $V_{ss}$. The gate of N-channel transistor 136 is coupled for receiving a source of operating potential such as, for example $V_{cc}$, and the gate of N-channel transistor 138 is connected to control terminal 112. N-channel transistor 140 has a gate connected to node 124, a source connected to output terminal 116, and a drain coupled for receiving a source of operating potential such as, for example, $V_{cc}$. N-channel transistor 140 prevents the voltage at output terminal 116 from making a high voltage to low voltage transition too quickly.

An exemplary range of voltages for $V_{cc}$ is from approximately 2.5 volts to approximately 4 volts and an exemplary range of voltages for $V_{ss}$ is from approximately −0.5 volts to approximately 0.5 volts. By way of example, sources of operating potential $V_{cc}$ and $V_{ss}$ are 3 volts and ground, respectively.

P-channel enhancement mode transistor 144 has a source connected to programming node 115, a gate connected to node 132, and a drain connected to a drain of an N-channel transistor 146 at node 150. A source of N-channel transistor 146 is connected to a drain of N-channel transistor 148 and a source of N-channel transistor 148 is coupled for receiving a source of operating potential such as, for example, $V_{ss}$. A gate of N-channel transistor 146 is coupled for receiving a source of operating potential such as, for example $V_{cc}$, and a gate of N-channel transistor 148 is connected to the output terminal of inverter 122 at node 128. P-channel enhancement mode transistor 152 has a gate connected to the drains of transistors 144 and 146 at node 150, a drain connected to the gate of P-channel enhancement mode transistor 130 at node 132, and a source connected to programming node 115. N-channel transistor 154 has a gate connected to the output terminal of inverter 120 at node 124, a source connected to the drains of transistors 144 and 146 and to the gate of transistor 152 at node 150, and a drain coupled for receiving a source of operating potential such as, for example, $V_{cc}$.

Load current compensation circuit 104 includes a differential amplifier 160 connected to a switching network 180 via a switching element 164. Switching network 180 is also referred to as a high voltage switch. More particularly, differential amplifier 160 has an input terminal 166 coupled for receiving an enable signal IREFCL_EN, a pair of input terminals 168 and 170 differentially coupled for receiving reference signals VREF and VREFR, and an output terminal. Input terminal 166 is also referred to as a switching terminal. Switching element 164 comprises a triple-well N-channel transistor having a gate connected to the output terminal of differential amplifier 160 at node 172, a source connected to load 162 at node 174, and a drain connected to switching network 180. Load 162 is also referred to as a load element. By way of example, load 162 is a resistive load. One well of triple-well N-channel transistor 164 is connected to a source of operating potential such as for example, $V_{cc}$. The second well and the source of triple-well N-channel transistor 164 are commonly connected. It should be noted that the voltage at node 174 serves as reference voltage VREFR and that node 174 is also referred to as a compensation node. Optionally a capacitor 178 is connected between node 172 and a source of operating potential such as, for example, $V_{ss}$. By way of example, capacitor 178 is a transistor in a capacitor configuration.

Switching network 180 of load current compensation circuit 104 includes a high voltage switch 182 having a pair of differential input terminals 184 and 186 coupled for receiving a differential load enable signal CLOADENn and CLOADENBn, respectively, and an input terminal 188 coupled for receiving programming voltage VPROG. An output terminal of high voltage switch 182 is connected to a gate of a P-channel enhancement mode transistor 190. P-channel enhancement mode transistor 190 has a source coupled for receiving programming signal VPROG and a drain connected to the drain of triple-well N-channel transistor 164 at node 183. Preferably, the source is connected to the body of P-channel enhancement mode transistor 190.

Optionally, input terminal 110 of write-buffer driver circuit 100 is coupled to input terminals 184 and 186 via a buffer 191 and an inverter 192, respectively. The input terminals of inverter 191 and buffer 192 are coupled for receiving programming bit information signal WDATn. The output terminal of buffer 191 is connected to input terminal 184 and the output terminal of inverter 192 is connected to input terminal 186. Preferably, the input signal coupled to input terminals 184 and 186 is a differential input signal.

The memory device is programmed in accordance with the logic or voltage levels of programming bit information signal WDATn and output node discharge signal PGMR. In particular, programming bit information signal WDATn indicates the individual bits of the word to be programmed and output node discharge signal PGMR sets the output node in a condition for programming. A bit is programmed when output node discharge signal PGMR is driven to a logic low voltage level and the voltage level of programming bit information signal WDATn is at a logic low voltage level, e.g., a voltage from approximately −0.5 volts to approximately 1.8 volts. When signals PGMR and WDATn are at logic low voltage levels, programming signal VPROG appears at output terminal 116 and is referred to as data signal DATABn. During operation, programming signal VPROG provides a voltage signal to several word-buffer drivers 102. Hence, the load current drawn from programming signal VPROG causes fluctuations in the magnitude of programming signal VPROG. When programming is complete, output node discharge signal PGMR is driven to a logic high voltage level to clear the voltage appearing at output terminal 116. In other words, output terminal 116 is set at ground potential. By way of example, a logic high voltage level may range from approximately 2.5 volts to approximately 4 volts.

When programming bit information signal WDATn is at a logic high voltage level, the input signal, CLOADENBn, appearing at input terminal 184 of high voltage switch 182 is at a logic low voltage level and the output signal of high voltage switch 182 is at a logic high voltage level. Under this condition, enhancement mode P-channel transistor 190 turns on and passes programming voltage VPROG to the drain of triple-well N-channel transistor 164. During this time, triple-well N-channel transistor 164 is operating in an idle mode or in a non-conducting state. Because triple-well N-channel transistor 164 is in a non-conducting state, the programming voltage VPROG appearing at its drain is not passed through transistor 164 to node 174. However, even in the absence of programming voltage VPROG at node 174, a load compensation current, $I_{CLOAD}$, flows through load 162, thereby creating a load voltage VREFR at node 174. VREFR is also referred to as a compensation voltage signal. Load 162 is also referred to as a programming load. When the voltage VREFR is the same as the reference voltage VREF appearing at input terminal 168, the output voltage of differential amplifier 160 remains at a logic low voltage level. The voltage VREFR begins to differ from voltage VREF as the number of loads driven by programming voltage VPROG increases. This causes differential amplifier 160 to generate an output voltage that eventually becomes sufficiently large to turn on triple-well N-channel transistor 164 and change the value of load current $I_{LOAD}$. The difference in voltages between VREF and VREFR is referred to as an error voltage. By way of example, triple-well N-channel transistor 164 conducts a load current of approximately 230 microamperes through each I/O buffer circuit and through each load 162.

Although a single write-buffer driver has been described, it should be understood that each I/O buffer includes a write-buffer circuit. Thus, for a sixteen bit word, there are sixteen I/O buffer circuits and at least sixteen programming nodes.

By now it should be appreciated that a memory device and a method for compensating for load current in the memory device have been provided. An advantage of the present invention is that the load current compensation circuit mitigates the fluctuations in programming voltage VPROG caused by different loads being driven by VPROG. This also ensures that the data bits will be programmed to the proper voltage levels, which in turn maintains the integrity of the read operations. An advantage of the present invention is that the number of load compensation circuits can be selected to ensure low current dissipation thereby avoiding excessive heat dissipation from the memory device. For example, rather than including a load current compensation circuit for every I/O buffer, a single load current compensation circuit may be included for eight I/O buffers.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A method for programming a memory device having a programming node, comprising:
   providing a programming voltage to the programming node;
   using the programming voltage to generate a load current;
   generating a load voltage at a compensation node of the memory device;
   generating an error voltage in response to the load voltage; and
   changing the load current in response to the error voltage.

2. The method of claim 1, wherein generating the error voltage includes comparing a reference voltage with the load voltage.

3. The method of claim 2, wherein the error voltage increases the load current when the reference voltage has a greater value than the load voltage.

4. The method of claim 1, wherein changing the load current further includes providing an enable signal at a switching terminal.

5. The method of claim 1, wherein providing the programming voltage includes providing the programming voltage to a plurality of programming nodes.

6. The method of claim 5, wherein providing the programming voltage includes providing the programming voltage to sixteen programming nodes.

7. The method of claim 1, wherein changing the load current includes increasing the load current.

8. A method for regulating a programming voltage in a memory device, comprising:
   generating a load current in accordance with the programming voltage; and
   changing the load current in response to a programming load by applying the programming voltage to a load compensation network, wherein the load compensation network changes the load current to simulate programming a predetermined number of data bits of the memory device.

9. The method of claim 8, wherein generating the load current further includes generating a load current in accordance with the number of data bits being programmed.

10. The method of claim 9, wherein the number of data bits being programmed is sixteen.

11. The method of claim 8, wherein the predetermined number of data bits is sixteen.

12. The method of claim 8, wherein changing the load current includes generating a load compensation current through a programming load.

13. The method of claim 8, wherein changing the load current includes:
   comparing a compensation voltage signal with a reference voltage signal to generate an error voltage signal;
   generating an output voltage signal in accordance with the error voltage signal; and
   using the output voltage signal to change the load current.

14. The method of claim 13, wherein using the output voltage signal to change the load current includes activating a transistor.

* * * * *